United States Patent
Almosnino

(10) Patent No.: US 10,634,705 B2
(45) Date of Patent: Apr. 28, 2020

(54) METHOD FOR DETERMINING THE CURRENT CONSUMPTION OF AN ACTIVE LOAD, FOR EXAMPLE A PROCESSING UNIT, AND ASSOCIATED ELECTRONIC DEVICE

(71) Applicant: STMicroelectronics (Alps) SAS, Grenoble (FR)

(72) Inventor: Patrick Almosnino, Voreppe (FR)

(73) Assignee: STMicroelectronics (Alps) SAS, Grenoble (FR)

( * ) Notice: Subject to any disclaimer, the term of this patent is extended or adjusted under 35 U.S.C. 154(b) by 172 days.

(21) Appl. No.: 15/451,495

(22) Filed: Mar. 7, 2017

(65) Prior Publication Data
US 2018/0080960 A1    Mar. 22, 2018

(30) Foreign Application Priority Data
Sep. 16, 2016 (FR) ...................... 16 58679

(51) Int. Cl.
*G01R 19/10* (2006.01)
*G01R 19/00* (2006.01)
(Continued)

(52) U.S. Cl.
CPC ......... *G01R 19/10* (2013.01); *G01R 19/0092* (2013.01); *G01R 19/16533* (2013.01);
(Continued)

(58) Field of Classification Search
CPC ................ G01R 19/10; G01R 19/0092; G01R 19/16533; G01R 15/09; G01R 1/203; G05F 1/625; G05F 1/46
See application file for complete search history.

(56) References Cited

U.S. PATENT DOCUMENTS 6,255,842 B1 *   7/2001  Hashimoto ........ G01R 31/2851
                                                        323/316
2002/0015319 A1   2/2002  Hartular et al.
(Continued)

FOREIGN PATENT DOCUMENTS

CN    204832328 U    12/2015
CN    207319096 U     5/2018
(Continued)

OTHER PUBLICATIONS

INPI Search Report and Written Opinion for FR 1658679 dated May 18, 2017 (8 pages).
(Continued)

*Primary Examiner* — Akm Zakaria
(74) *Attorney, Agent, or Firm* — Crowe & Dunlevy

(57) ABSTRACT

A first resistor and a second resistor are coupled in series between a voltage source and an active load. When the current drawn by the active load exceeds a current threshold corresponding to a maximum admissible voltage drop across the first resistor, a stabilization current is delivered to the node common to the series coupled first and second resistors in such a way as to stabilize the voltage on the terminals of the active load at a threshold value. In the presence of such a current in excess of the current threshold, the current consumed by the active load is measured from the voltage drop across the second resistor. Conversely, if the current is less than the current threshold, the current consumed by the active load is measured from the voltage drop across the first resistor.

33 Claims, 2 Drawing Sheets

(51) Int. Cl.
    *G01R 19/165*     (2006.01)
    *G05F 1/625*     (2006.01)
    *G05F 1/46*     (2006.01)
    *G01R 1/20*     (2006.01)
    *G01R 15/09*     (2006.01)

(52) U.S. Cl.
    CPC .............. *G05F 1/625* (2013.01); *G01R 1/203* (2013.01); *G01R 15/09* (2013.01); *G05F 1/46* (2013.01)

(56) References Cited

U.S. PATENT DOCUMENTS

| | | | |
|---|---|---|---|
| 2006/0244433 A1* | 11/2006 | Nakahara | G01R 31/30 324/76.11 |
| 2009/0179652 A1 | 7/2009 | Obara | |
| 2011/0235372 A1* | 9/2011 | Mohr | G01R 19/0092 363/39 |
| 2017/0271975 A1* | 9/2017 | Plojhar | H02M 1/32 |

FOREIGN PATENT DOCUMENTS

| | | | |
|---|---|---|---|
| EP | 2908417 A1 | 8/2015 | |
| EP | 3007351 A2 | 4/2016 | |

OTHER PUBLICATIONS

First Office Action and Search Report from co-pending CN Appl. No. 201710161201.3 dated Mar. 28, 2019 (6 pages).

\* cited by examiner

METHOD FOR DETERMINING THE CURRENT CONSUMPTION OF AN ACTIVE LOAD, FOR EXAMPLE A PROCESSING UNIT, AND ASSOCIATED ELECTRONIC DEVICE

PRIORITY CLAIM

This application claims the priority benefit of French Application for Patent No. 1658679, filed on Sep. 16, 2016, the content of which is hereby incorporated by reference in its entirety to the maximum extent allowable by law.

TECHNICAL FIELD

Embodiments relate to electronic circuits and, quite particularly, those used to measure the current consumption of an active load, for example a processing unit.

BACKGROUND

Conventionally, it is possible to measure the current consumption of an electronic device by measuring the voltage on the terminals of a resistor connected, for example, between a voltage source and the processing unit. These resistors are generally connected to an operational amplifier which delivers as output the voltage on the terminals of the resistor.

However, some applications require the use of active loads, for example processing units, consuming a current of which the value may vary very substantially during a very short time. For example, it is possible for a processing unit to consume a current having a mean value of 0.3 microamperes for several seconds, then, due to the implementation of a specific operation, to consume a current of 3 milliamperes for 0.5 milliseconds.

It is thus necessary to be able to measure a current having a broad dynamic range, at a high frequency in order not to miss the measurement of very brief events, such as current consumption peaks.

It is not currently possible to perform such measurements with a single resistor connected to an amplifier. In fact, amplifiers capable of operating at high frequencies generate noise that is too high to be suitable for measuring very low current.

Measurement circuits also exist which include two resistors, each connected to an amplifier, one dedicated to measuring low currents, the other to measuring high currents, and a switching system allowing the voltage on one or the other of the two resistors to be read; however, the transition does not take place quickly enough and it is possible that some samples are lost during the switching.

SUMMARY

A method and a measuring device are therefore proposed here which allow the measurement at a high frequency of a current consumed by an active load, for example a processing unit such as a microprocessor or a microcontroller, consuming a current having a broad dynamic range.

According to one aspect, a method is proposed for determining the value of a current consumed by an active load, for example a processing unit, fed by a first voltage source (for example, 3 volts), in which:

a first resistor and a second resistor are disposed in series between the voltage source and a first terminal of the active load, the first resistor having a resistance value (for example, 1000 ohms) greater than a resistance value of the second resistor (for example, 2 ohms), a maximum admissible voltage drop (for example, 100 mV, corresponding to a maximum admissible current, here 100 microamperes) on the terminals of the first resistor, taking account of the resistance value of the first resistor is defined, and, if the voltage on the first terminal is less than a threshold value (for example, 2.9 volts) equal to the value of the voltage delivered by said first voltage source minus said admissible voltage drop, the voltage on the first terminal of the active load is stabilized at the threshold value, a first difference in potential on the terminals of the first resistor and a second difference in potential on the terminals of the second resistor are measured simultaneously, if the first difference in potential is less than said maximum admissible voltage drop, the value of the consumed current is determined on the basis of the first difference in potential, and if the voltage is greater than or equal to said maximum admissible voltage drop, the value of the consumed current is determined on the basis of the second difference in potential.

Thus, according to this aspect, a first resistor dedicated to the measurement of low currents and a second resistor dedicated to the measurement of high currents are disposed in series with a voltage source.

The low currents drawn by the active load can be measured by the first resistor delivering on its terminals a readable difference in potential compared with the difference in potential on the terminals of the second resistor.

The voltage on the terminals of the active load drops during the current increase, mainly due to the voltage drop on the terminals of the first resistor.

When the current drawn by the active load exceeds a current threshold (for example, 100 microamperes) corresponding to the maximum admissible voltage drop (for example, 100 mV) on the terminals of the first resistor (with a resistance, for example, of 1000 ohms), a current is delivered to the node common to the two resistors in such a way as to stabilize the voltage on the terminals of the active load at the threshold value (for example, 2.9 volts). And in the presence of such high currents, the current consumed by the active load can be measured in the second resistor.

Both high currents and low currents can thus be measured. The low currents are measured in the first resistor with a sensitivity N times greater than that which would be present in the second resistor, N being the ratio between the resistance value of the first resistor and the resistance value of the second resistor.

Furthermore, the simultaneous measurement of the two differences in potential on the terminals of the two resistors allows any switching and therefore sample losses to be avoided.

The ratio N between the resistance values of the two resistors depends on the envisaged application and the desired sensitivity.

By way of indication, it is preferable to be able to measure the consumed current in such a way that the ratio between the resistance value of the first resistor and the resistance value of the second resistor is between 100 and 1000.

According to one embodiment, the voltage on the first terminal of the active load is stabilized by comparing said voltage to said threshold value and by injecting a current proportional to the difference between the threshold value and the value of said voltage into the node common to the two resistors.

According to a different aspect, an electronic circuit, for example an integrated circuit, is proposed, including an input terminal intended to be connected to a first voltage source, an output terminal intended to be connected to an active load and processing circuitry configured to determine a consumed current on said output terminal.

The processing circuitry includes:
- a first resistor and a second resistor mounted in series between the input terminal and the output terminal, the first resistor having a resistance value greater than a resistance value of the second resistor,
- a first measuring circuit and a second measuring circuit respectively configured to measure simultaneously a first difference in potential on the terminals of the first resistor and a second difference in potential on the terminals of the second resistor,
- a stabilization circuit configured to stabilize the voltage on the output terminal at a threshold value equal to the value of the voltage delivered by said first voltage source minus a maximum admissible voltage drop on the terminals of the first resistor if the voltage on the output terminal is less than said threshold voltage, and
- a determination circuit configured to determine the current consumed on the output terminal on the basis of the first difference in potential if the first difference in potential is less than said maximum admissible voltage drop and on the basis of the second difference in potential if the first difference in potential is greater than or equal to said maximum admissible voltage drop.

According to one embodiment, the stabilization circuit comprises a comparison circuit configured to compare said voltage present on the output terminal with said threshold value and an additional circuit configured to inject a current proportional to the difference between the value of the voltage present on the output terminal and said threshold value into the node common to the two resistors.

The comparison circuit may comprise a differential amplifier, the inverting input of which is connected to the output terminal, the non-inverting input of which is intended to receive said threshold value. The additional circuit may comprise a transistor, the control electrode of which is connected to the output of the differential amplifier, a first conduction electrode of which is connected to an additional voltage source and a second conduction electrode of which is connected to said node common to the two resistors.

The differential amplifier is then advantageously configured to deliver an output voltage resulting in a blocking of said transistor when the voltage present on the output terminal is greater than or equal to the threshold voltage.

According to one embodiment, the ratio between the resistance value of the first resistor and the resistance value of the second resistor is between 100 and 1000.

According to one embodiment,
- the first measuring circuit includes a first operational amplifier, the inputs of which are connected to the terminals of the first resistor,
- the second measuring circuit includes a second operational amplifier, the inputs of which are connected to the terminals of the second resistor, and
- the determination circuit includes two analog to digital converters respectively connected to the output of the first and second measuring circuits, and a processing circuit configured to compare the output of the first measuring circuit with said maximum admissible voltage drop and to select the samples delivered by the corresponding analog to digital converter according to the result of said comparison.

The output terminal may be intended to be connected to a processing unit forming said active load.

BRIEF DESCRIPTION OF THE DRAWINGS

Other advantages and characteristics of the invention will be evident from an examination of the detailed description of embodiments, which are in no way limiting, and the attached drawings, in which.

DETAILED DESCRIPTION

Figure 1:
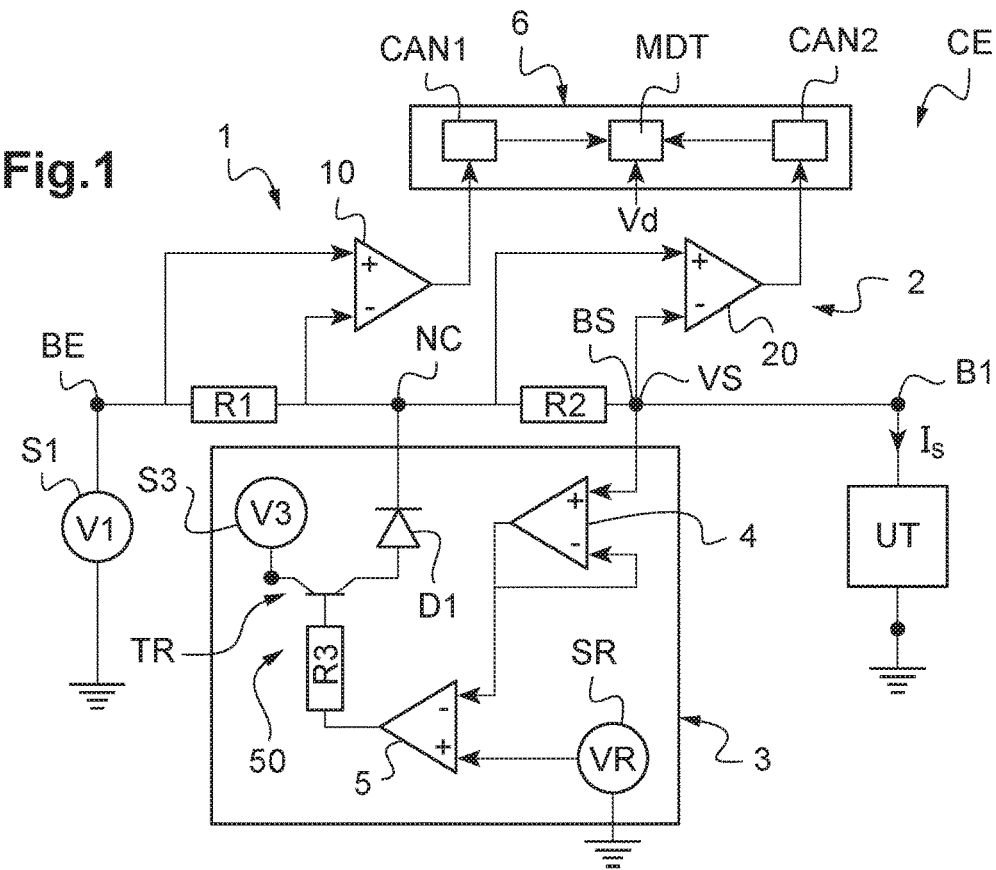
FIG. 1 shows schematically an electronic circuit.

FIG. 1 shows schematically, from an electrical perspective, an electronic circuit CE according to one embodiment.

The circuit CE comprises an input terminal BE and an output terminal BS connected to a first terminal B1 of an active load, here a processing unit UT, for example a microprocessor. The circuit CE is configured to determine the current $I_S$ consumed by the processing unit UT.

Here, the processing unit UT is capable of consuming a current, the value of which may vary by a factor of ten thousand, for example here in a dynamic range from 100 nanoamperes to 10 milliamperes.

The circuit CE comprises a first voltage source S1 connected to the input terminal and configured to feed the processing unit UT with a voltage V1. Here, the first voltage source V1 supplies a voltage V1 of 3 volts.

Two resistors R1 and R2 are connected in series between the input terminal BE and the output terminal BS. The resistor R1 has a resistance value much higher than the resistance value of the resistor R2. Here, for example, the first resistor R1 and the second resistor R2 have resistance values of 1000 ohms and 2 ohms respectively.

The circuit CE also comprises first measuring circuit 1, configured to measure a first difference in potential on the terminals of the first resistor R1. Here, the first measuring circuit 1 comprises a first differential amplifier 10 (implemented here with one or more operational amplifiers), the two inputs (inverting and non-inverting) of which are connected to the terminals of the first resistor R1.

The circuit CE also comprises second measuring circuit 2, configured to measure a second difference in potential on the terminals of the second resistor R2. Here, the second measuring circuit 2 comprises a second differential amplifier 20 (implemented here with one or more operational amplifiers), the two inputs (inverting and non-inverting) of which are connected to the terminals of the second resistor R2.

The two measuring circuits 1 and 2 respectively measure the two differences in potential across the resistors R1 and R2 simultaneously and continually.

The circuit CE further comprises a stabilization circuit 3 configured to stabilize the voltage VS on the output terminal BS at a threshold value VR equal to the value of the voltage V1 delivered by said first voltage source S1 minus a maximum admissible voltage drop Vd on the terminals of the first resistor R1 if the voltage VS on the output terminal BS is lower than said threshold voltage VR.

When the processing unit UT is in operation, it can perform operations that require the consumption of a current $I_S$. According to the operations, the consumed current $I_S$ is more or less high, and may vary, for example, between 100 nanoamperes and 10 milliamperes.

The flow of the current $I_S$ through the first resistor R1 and through the second resistor R2 causes an increase in the voltage on the terminals of said resistors, and therefore an equivalent voltage reduction on the terminals of the processing unit UT. The resistor R1, due to its resistance value which is much higher than the resistance value of the resistor R2, is mainly responsible for this voltage drop.

In fact, an excessive voltage reduction may interfere with the correct operation of the processing unit.

A threshold voltage VR is therefore set, below which the voltage VS on the terminals of the processing unit must not fall.

Here, for example, the threshold voltage is set at 2.9 volts, i.e. an attempt is made to avoid a voltage drop Vd of more than 0.1 volts on the terminals of the processing unit and consequently on the terminals of the first resistor R1 which is mainly responsible therefor. This maximum admissible value Vd for the voltage drop on the terminals of the first resistor R1 corresponds here to a threshold current equal to 100 microamperes.

The stabilization circuit 3 is configured to stabilize the voltage VS on the output terminal BS at the threshold value VR equal to the value of the voltage V1 delivered by said first voltage source S1 minus the maximum admissible voltage drop Vd on the terminals of the first resistor R1 if the voltage VS on the output terminal is below said threshold voltage VR.

Here, the stabilization circuit 3 comprises a comparison circuit 5 configured to compare said voltage VS present on the output terminal BS with said threshold value VR and an additional circuit 50 configured to inject a current proportional to the difference between the value of the voltage VS present on the output terminal and said threshold value VR into the node NC common to the two series connected resistors R1 and R2.

The comparison circuit 5 comprises a differential amplifier, the inverting "−" input of which is connected to a second voltage source SR delivering the threshold voltage VR (equal to V1−Vd).

The non-inverting "+" input of the differential amplifier is connected to the output of a unity-gain voltage follower amplifier 4, the non-inverting "+" input of which is connected to the output terminal BS.

The additional circuit 50 comprises a third resistor R3 connected to the base (control electrode) of a transistor TR, here a bipolar transistor, a first conduction electrode of which is connected to an additional voltage source S3 delivering a voltage V3, and a second conduction electrode of which is connected to the anode of a diode D1.

The cathode of the diode D1 is connected to the common node NC.

Here, the role of the resistor R3 is to protect the transistor TR against overcurrent.

The differential amplifier forming the comparison circuit 5 is configured, here by its high gain, for example 200, to deliver an output voltage resulting in a blocking of said transistor TR from turning on when the voltage present on the output terminal BS is greater than or equal to the threshold voltage VR.

More precisely, if the voltage VS, copied onto the inverting input of the differential amplifier 5 by the follower amplifier 4, is between the voltage V1 and the threshold voltage VR, corresponding to a low current drawn by the load, the amplifier 5, due to its high gain, delivers a very low, or even virtually zero, output voltage, blocking the transistor TR. No current is then injected into the common node.

However, if the voltage VS becomes less than the threshold voltage VR, corresponding to a high current drawn by the load, the amplifier 5 then delivers a positive output voltage on the base of the transistor TR, sufficient to turn on the transistor and allow it to deliver a current proportional to the voltage present on its base and therefore proportional to the difference VS−VR. A current is then injected into the common node NC in such a way as to stabilize the voltage VS at the threshold voltage VR.

The circuit CE further includes a determination circuit 6 configured to determine from the current $I_S$ consumed on the output terminal BS: on the basis of a first difference in potential (on the terminals of R1) whether this first difference in potential is less than said maximum admissible voltage drop Vd; and on the basis of the second difference in potential (on the terminals of R2) whether if the first difference in potential (on the terminals of R1) is greater than or equal to said maximum admissible voltage drop Vd.

More precisely, in this example embodiment, the determination circuit 6 includes two analog to digital converters CAN1, CAN2 connected to the output of the first measuring circuit 1 and the second measuring circuit 2 respectively, and a processing circuit MDT, for example a microprocessor, configured to compare the output of the first measuring circuit with said maximum admissible voltage drop Vd and to select the samples delivered by the corresponding analog to digital converter according to the result of said comparison.

Figure 2:
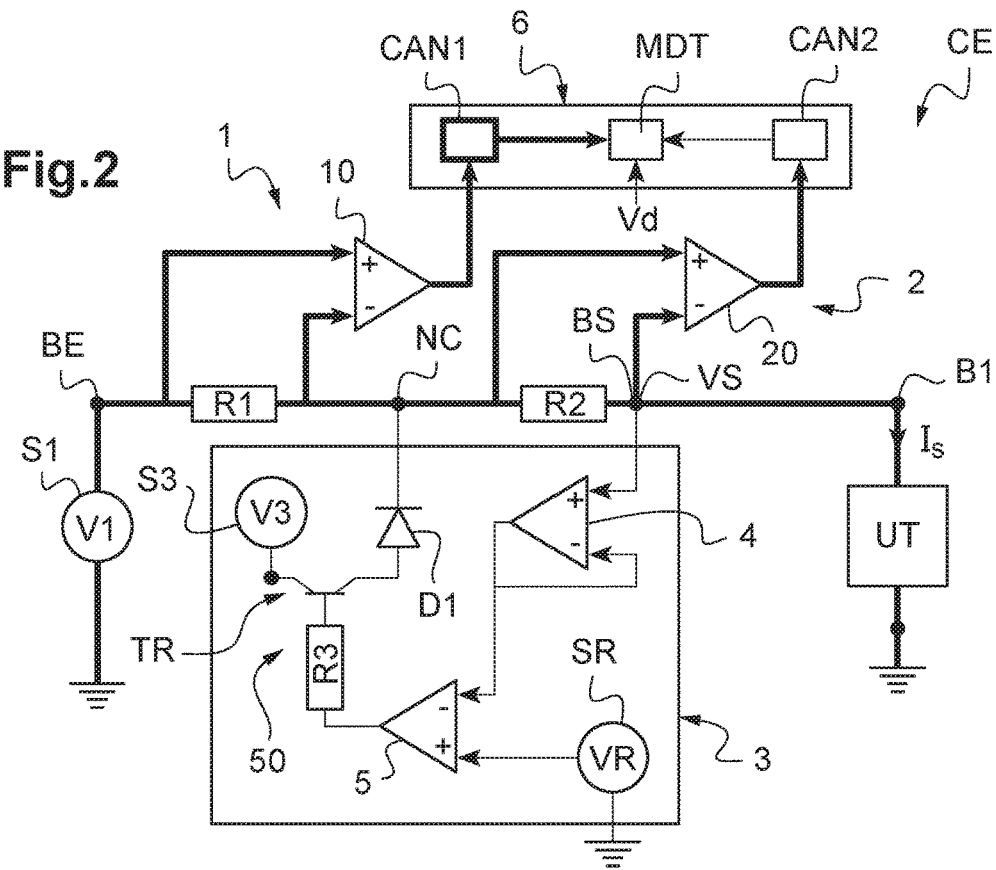
FIGS. 2 and 3 show methods of operation.

More precisely, as shown in FIG. 2, the two outputs of the two amplifiers 10 and 20 are sampled simultaneously.

If the processing module MDT establishes that the difference in potential on the terminals of the first resistor R1 is less than Vd (i.e., if the drawn current is low, here less than 100 microamperes), then samples originating from the first analog to digital converter CAN1 are selected by the processing circuit MDT to determine the value of the consumed current $I_S$ (FIG. 2). And in this case, no current is injected into the common node NC.

Figure 3:
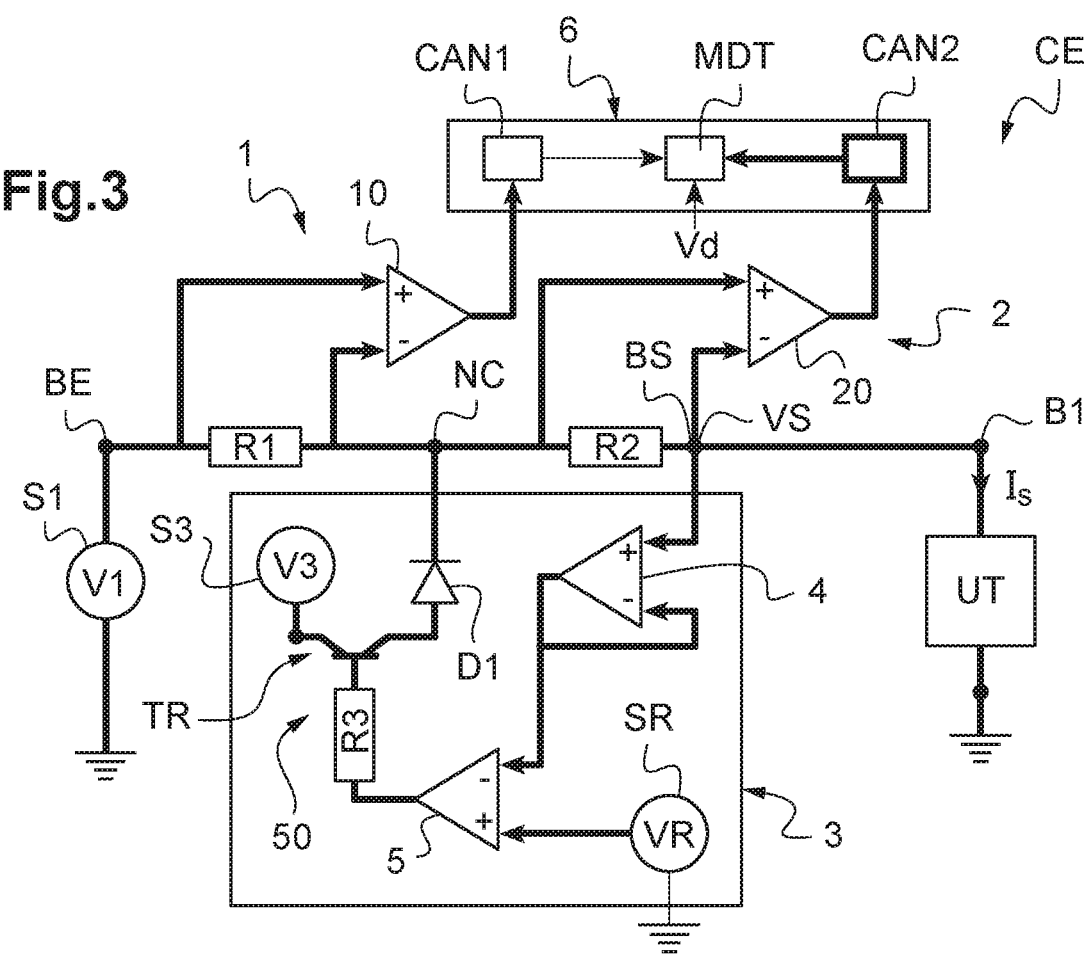

Conversely, as shown in FIG. 3, if the processing circuit MDT establishes that the difference in potential on the terminals of the first resistor R1 is greater than Vd (i.e., if the drawn current is high, here more than 100 microamperes), then samples originating from the second analog to digital converter CAN2 are selected by the processing circuit MDT to determine the value of the consumed current $I_S$. And in this case, current is injected into the common node NC to stabilize the output voltage VS at the threshold voltage VR.

It is then possible to retrieve the values determined by the microprocessor 6 using a computer, for example using a USB connection (not shown).

The invention claimed is:

1. A method for determining a value of a current consumed by an active load fed by a first voltage source, in which a first resistor and a second resistor are connected in series between the first voltage source and a first terminal of the active load, the first resistor having a resistance value greater than a resistance value of the second resistor, the method comprising:
    defining a maximum admissible voltage drop on terminals of the first resistor;
    simultaneously measuring a first difference in potential on the terminals of the first resistor and a second difference in potential on terminals of the second resistor;
    detecting if the first difference in potential is less than said maximum admissible voltage drop and, in response to the first difference in potential being less than said maximum admissible voltage drop, determining the value of the current consumed on the basis of the first difference in potential;

detecting if the first difference in potential is equal to said maximum admissible voltage drop and, in response to the first difference in potential being equal to the maximum admissible voltage drop, determining the value of the current consumed on the basis of the second difference in potential; and detecting if the first difference in potential is greater than said maximum admissible voltage drop and, in response to the first difference in potential being greater than said maximum admissible voltage drop, determining the value of the current consumed on the basis of the second difference in potential.

2. The method according to claim 1, further comprising stabilizing a voltage on the first terminal of the active load at a threshold value equal to a value of the voltage delivered by said first voltage source minus said maximum admissible voltage drop.

3. The method according to claim 2, wherein stabilizing comprises:

comparing said voltage on the first terminal to said threshold value; and performing stabilization if the voltage on the first terminal is less than the threshold value.

4. The method according to claim 3, wherein performing stabilization comprises injecting a current proportional to a difference between the threshold value and the voltage on the first terminal into a common node between the series connected first and second resistors.

5. The method according to claim 2, wherein performing stabilization occurs while determining the value of the current consumed on the basis of the second difference in potential.

6. The method according to claim 5, wherein performing stabilization comprises injecting a current into a common node between the series connected first and second resistors.

7. The method according to claim 6, wherein said current has a value proportional to a difference between the threshold value and the voltage on the first terminal.

8. The method according to claim 1, wherein a ratio between the resistance value of the first resistor and the resistance value of the second resistor is between 100 and 1000.

9. The method according to claim 1, wherein the active load includes a processing unit.

10. An electronic circuit, comprising:

an input terminal configured to be connected to a first voltage source;

an output terminal configured to be connected to an active load;

a circuit configured to determine a current consumed at said output terminal, comprising:

a first resistor and a second resistor connected in series between the input terminal and the output terminal, the first resistor having a resistance value greater than a resistance value of the second resistor;

a first measuring circuit configured to measure a first difference in potential on terminals of the first resistor;

a second measuring circuit configured to measure a second difference in potential on terminals of the second resistor;

wherein the measurement of the first and second differences in potential are performed simultaneously; and a determination circuit configured to:

detect if the first difference in potential is less than a maximum admissible voltage drop and, in response to the first difference in potential being less than said maximum admissible voltage drop, determine the current consumed on the output terminal on the basis of the first difference in potential;

detecting if the first difference in potential is equal to said maximum admissible voltage drop and, in response to the first difference in potential being equal to said maximum admissible voltage drop, determining the value of the current consumed on the output terminal on the basis of the second difference in potential; and detect if the first difference in potential is greater than said maximum admissible voltage drop and, in response to the first difference in potential being greater than said maximum admissible voltage drop, determine the current consumed on the output terminal on the basis of the second difference in potential.

11. The electronic circuit according to claim 10, further comprising a stabilization circuit configured to stabilize a voltage on the output terminal at a threshold value equal to a value of a voltage delivered by said first voltage source minus the maximum admissible voltage drop.

12. The electronic circuit according to claim 11, wherein the stabilization circuit comprises:

a comparison circuit configured to compare said voltage present on the output terminal to said threshold value; and an additional circuit configured to stabilize the voltage present on the output terminal if the voltage present on the output terminal is less than said threshold value.

13. The electronic circuit according to claim 12, wherein said additional circuit is configured to inject a current proportional to a difference between the voltage present on the output terminal and said threshold value into a common node between the series connected first and second resistors.

14. The electronic circuit according to claim 12, wherein said additional circuit is activated while said determination circuit determines the current consumed on the output terminal on the basis of the second difference in potential.

15. The electronic circuit according to claim 12, wherein the comparison circuit comprises a differential amplifier having an inverting input coupled to the output terminal and a non-inverting input configured to receive said threshold value; and wherein the additional circuit comprises a transistor having a control electrode coupled to an output of the differential amplifier, a first conduction electrode coupled to an additional voltage source and a second conduction electrode coupled to a common node between the series connected first and second resistors.

16. The electronic circuit according to claim 15, wherein said differential amplifier is configured to deliver an output voltage blocking turning on of said transistor when the voltage present on the output terminal is greater than or equal to the threshold value.

17. The electronic circuit according to claim 10, wherein a ratio between the resistance value of the first resistor and the resistance value of the second resistor is between 100 and 1000.

18. The electronic circuit according to claim 10, wherein the first measuring circuit comprises a first operational amplifier having inputs connected to the terminals of the first resistor; and wherein the second measuring circuit comprises a second operational amplifier having inputs connected to the terminals of the second resistor.

19. The electronic circuit according to claim 10, wherein the determination circuit comprises:
   a first analog to digital converter connected to an output of the first measuring circuit;
   a second analog to digital converter connected to an output of the second measuring circuit; and
   a processing circuit coupled to outputs of the first and second analog to digital converter circuits and configured to compare the output of the first measuring circuit with said maximum admissible voltage drop and to:
      select samples output from the first analog to digital converter circuit to determine the current consumed on the output terminal if the output of the first measuring circuit is less than said maximum admissible voltage drop; and
      select samples output from the second analog to digital converter circuit to determine the current consumed on the output terminal if the output of the first measuring circuit is greater than or equal to said maximum admissible voltage drop.

20. The electronic circuit according to claim 10, wherein the active load is a processing unit.

21. A method for determining a value of a current consumed by an active load fed by a first voltage source, in which a first resistor and a second resistor are connected in series between the first voltage source and a first terminal of the active load, the first resistor having a resistance value greater than a resistance value of the second resistor, the method comprising:
   measuring a first difference in potential on terminals of the first resistor;
   detecting a low current condition if the first difference in potential is less than a maximum admissible voltage drop;
   detecting a high current condition if the first difference in potential exceeds said maximum admissible voltage drop;
   detecting an equal current condition if the first difference in potential is equal to said maximum admissible voltage drop;
   stabilizing a voltage on the first terminal of the active load at a threshold value equal to a value of a voltage delivered by said first voltage source minus said maximum admissible voltage drop;
   measuring a second difference in potential on terminals of the second resistor;
   determining the value of the current consumed on the basis of the first difference in potential in response to the detected low current condition;
   determining the value of the current consumed on the basis of the second difference in potential in response to the detected high current condition; and
   determining the value of the current consumed on the basis of the second difference in potential in response to the detected equal current condition.

22. The method according to claim 21, wherein stabilizing the voltage comprises injecting a stabilization current into a common node between the series connected first and second resistors.

23. The method according to claim 22, wherein said stabilization current has a value proportional to a difference between the threshold value and the voltage on the first terminal.

24. The method according to claim 21, wherein a ratio between the resistance value of the first resistor and the resistance value of the second resistor is between 100 and 1000.

25. An electronic circuit, comprising:
   an input terminal configured to be connected to a first voltage source;
   an output terminal configured to be connected to an active load;
   a circuit configured to determine a current consumed at said output terminal, comprising:
   a first resistor and a second resistor connected in series between the input terminal and the output terminal, the first resistor having a resistance value greater than a resistance value of the second resistor;
   a first measuring circuit configured to measure a first difference in potential on terminals of the first resistor;
   a second measuring circuit configured to measure a second difference in potential on terminals of the second resistor;
   a determination circuit configured to:
      detect a high current condition if the first difference in potential exceeds a maximum admissible voltage drop;
      detect an equal current condition if the first difference in potential is equal to said maximum admissible voltage drop;
      detect a low current condition if the first difference in potential is less than said maximum admissible voltage drop;
      determine a value of the current consumed on the basis of the second difference in potential in response to the detected high current condition;
      determine the value of the current consumed on the basis of the second difference in potential in response to the detected equal current condition; and
      determine the value of the current consumed on the basis of the first difference in potential in response to the detected low current condition; and
   a stabilization circuit configured to stabilize a voltage on the output terminal at a threshold value equal to a value of a voltage delivered by said first voltage source minus the maximum admissible voltage drop.

26. The electronic circuit according to claim 25, wherein stabilization circuit is configured to inject a stabilization current into a common node between the series connected first and second resistors.

27. The electronic circuit according to claim 26, wherein said stabilization current has a value proportional to a difference between the threshold value and the voltage on the first resistor.

28. The electronic circuit according to claim 25, wherein a ratio between the resistance value of the first resistor and the resistance value of the second resistor is between 100 and 1000.

29. The electronic circuit according to claim 10, wherein the first resistor has a first terminal directly electrically connected to the first voltage source, wherein the second resistor has a first terminal directly electrically connected to a second terminal of the first resistor, and wherein the second resistor has a second terminal directly electrically connected to the first terminal of the active load.

30. An electronic circuit, comprising:
   an input terminal configured to be connected to a first voltage source;
   an output terminal configured to be connected to an active load;

a circuit configured to determine a current consumed at said output terminal, comprising:
- a first resistor and a second resistor connected in series between the input terminal and the output terminal, the first resistor having a resistance value greater than a resistance value of the second resistor;
- a first measuring circuit configured to measure a first difference in potential on terminals of the first resistor;
- a second measuring circuit configured to measure a second difference in potential on terminals of the second resistor;
- wherein the measurement of the first and second differences in potential are performed simultaneously; and
- a determination circuit configured to:
  - detect if the first difference in potential is less than a maximum admissible voltage drop and, in response, determine the current consumed on the output terminal on the basis of the first difference in potential; and
  - detect if the first difference in potential is greater than or equal to said maximum admissible voltage drop and, in response, determine the current consumed on the output terminal on the basis of the second difference in potential; and
- a stabilization circuit configured to stabilize a voltage on the output terminal at a threshold value equal to a value of a voltage delivered by said first voltage source minus the maximum admissible voltage drop, wherein the stabilization circuit comprises:
  - a comparison circuit configured to compare said voltage present on the output terminal to said threshold value, wherein the comparison circuit comprises a differential amplifier having an inverting input coupled to the output terminal and a non-inverting input configured to receive said threshold value; and
  - an additional circuit configured to stabilize the voltage present on the output terminal if the voltage present on the output terminal is less than said threshold value, wherein the additional circuit comprises a transistor having a control electrode coupled to an output of the differential amplifier, a first conduction electrode coupled to an additional voltage source and a second conduction electrode coupled to a common node between the series connected first and second resistors.

31. The electronic circuit according to claim 30, wherein said differential amplifier is configured to deliver an output voltage blocking turning on of said transistor when the voltage present on the output terminal is greater than or equal to the threshold value.

32. The electronic circuit according to claim 30, wherein a ratio between the resistance value of the first resistor and the resistance value of the second resistor is between 100 and 1000.

33. The electronic circuit according to claim 30,
wherein the first measuring circuit comprises a first operational amplifier having inputs connected to the terminals of the first resistor; and
wherein the second measuring circuit comprises a second operational amplifier having inputs connected to the terminals of the second resistor.

\* \* \* \* \*